(12) United States Patent
Takyu et al.

(10) Patent No.: US 6,699,774 B2
(45) Date of Patent: Mar. 2, 2004

(54) WAFER SPLITTING METHOD USING CLEAVAGE

(75) Inventors: Shinya Takyu, Kitakatsushika-gun (JP); Tetsuya Kurosawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/306,008

(22) Filed: Nov. 29, 2002

(65) Prior Publication Data
US 2003/0129809 A1 Jul. 10, 2003

(30) Foreign Application Priority Data
Nov. 30, 2001 (JP) ...................................... 2001-367949
Oct. 22, 2002 (JP) ...................................... 2002-307169

(51) Int. Cl.[7] .......................................... H01L 21/301
(52) U.S. Cl. ...................... 438/460; 438/461; 438/462; 438/463
(58) Field of Search ................................ 438/460, 461, 438/463, 464

(56) References Cited

U.S. PATENT DOCUMENTS

| 5,888,883 A | 3/1999 | Sasaki et al. |
| 6,184,109 B1 | 2/2001 | Sasaki et al. |
| 6,257,224 B1 * | 7/2001 | Yoshino et al. .......... 125/13.01 |
| 6,294,439 B1 | 9/2001 | Sasaki et al. |
| 6,337,258 B1 | 1/2002 | Nakayoshi et al. |
| 2002/0019074 A1 * | 2/2002 | Nakazawa et al. .......... 438/107 |

OTHER PUBLICATIONS

Shinya Takyu et al., "Semiconductor Device Manufacturing Method for Reinforcing Chip by Use of Seal Member at Pickup Time", US patent application Ser. No. 10/187,629, filed on Jul. 3, 2002.

Kazuhiro Takahashi et al., "Surface Protective Sheet For Use In Wafer Back Grinding And Method Of Use Thereof", U.S. patent application No. 09/387,705 filed Aug. 18, 1999, US patent 6,465,330.

* cited by examiner

Primary Examiner—Richard Elms
Assistant Examiner—Brad Smith
(74) Attorney, Agent, or Firm—Finnegan, Henderson, Farabow, Garrett & Dunner, L.L.P.

(57) ABSTRACT

Notches are formed in a surface of a wafer on which semiconductor elements have been formed. Then, a surface protection tape is stuck to the element-formed surface of the wafer. Subsequently, the wafer is cleaved along a crystal orientation using the notches as starting points. Finally, a back surface of the wafer is ground.

20 Claims, 14 Drawing Sheets

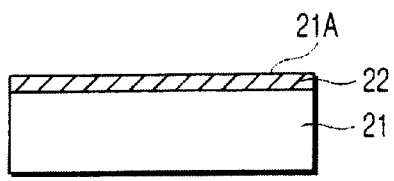
FIG. 1A
PRIOR ART
FIG. 1B
PRIOR ART
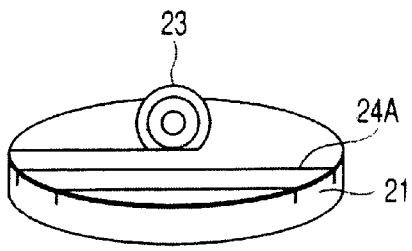
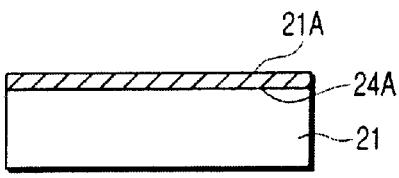
FIG. 2A
PRIOR ART
FIG. 2B
PRIOR ART
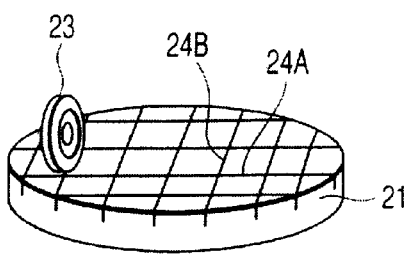
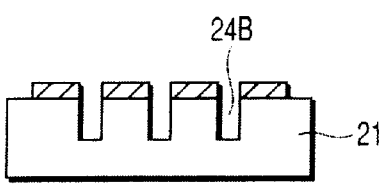
FIG. 3A
PRIOR ART
FIG. 3B
PRIOR ART
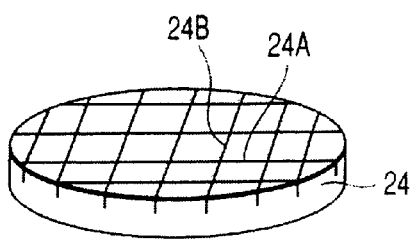
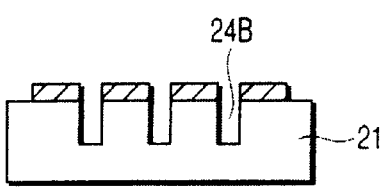
FIG. 4A
PRIOR ART
FIG. 4B
PRIOR ART

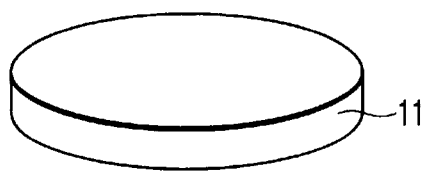
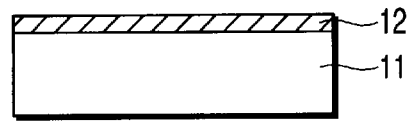
FIG. 9A  FIG. 9B
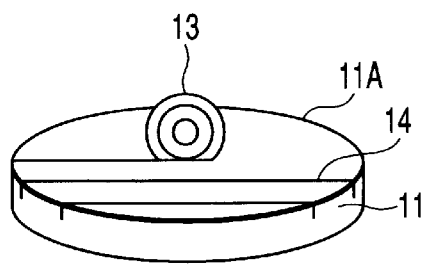
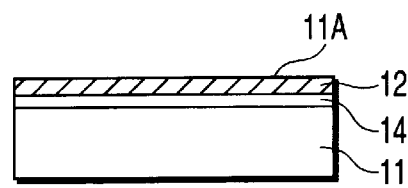
FIG. 10A  FIG. 10B
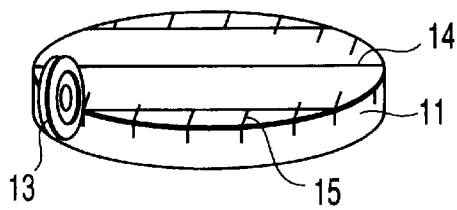
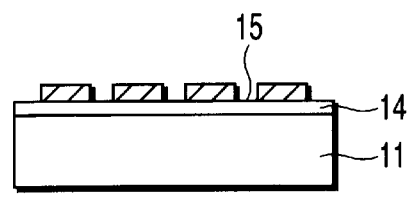
FIG. 11A  FIG. 11B
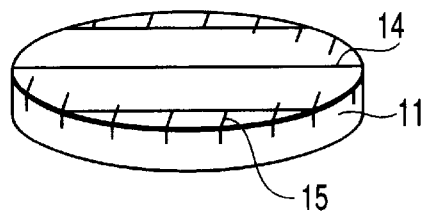
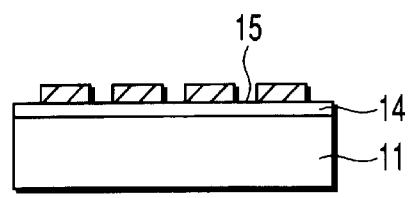
FIG. 12A  FIG. 12B

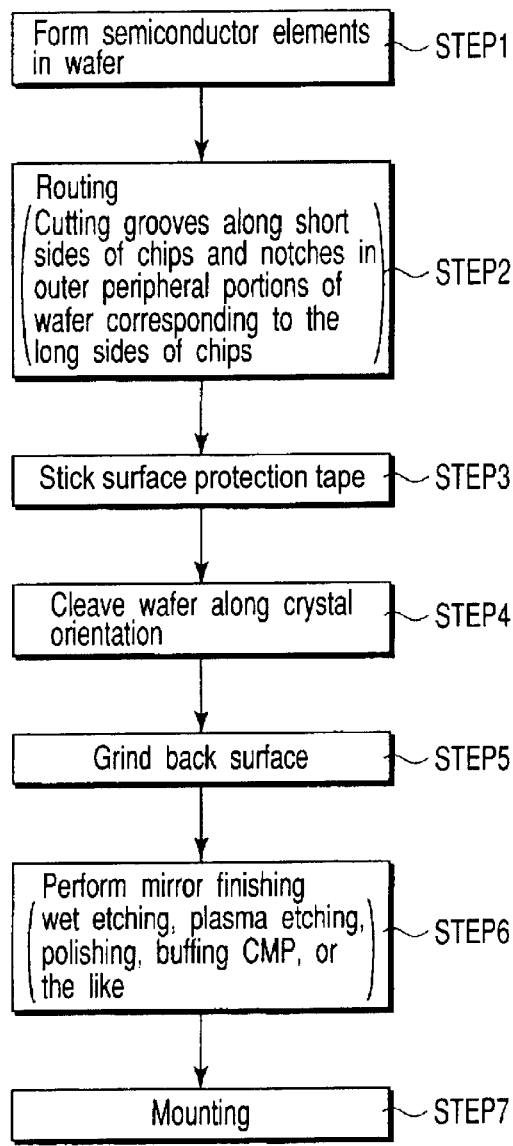
F I G. 21
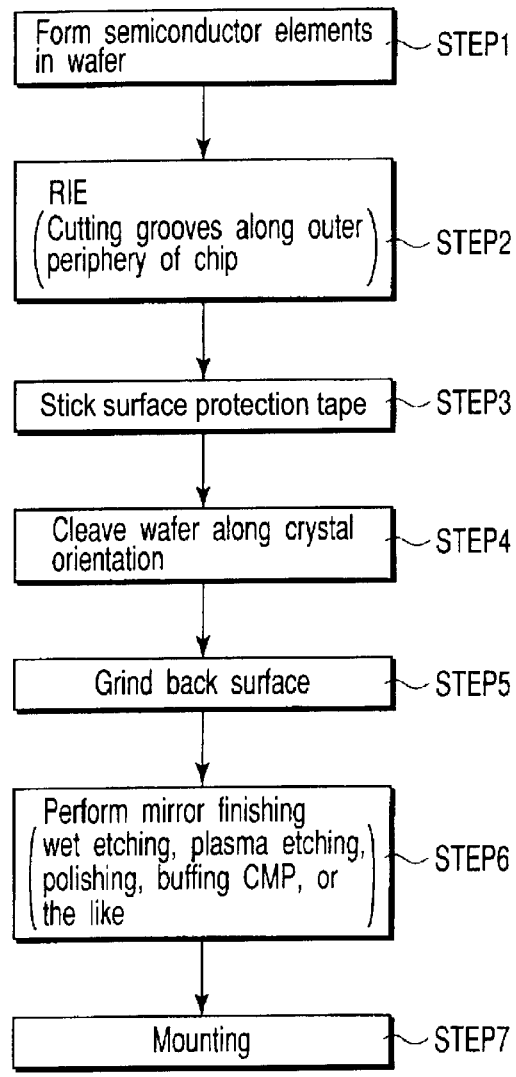
F I G. 22

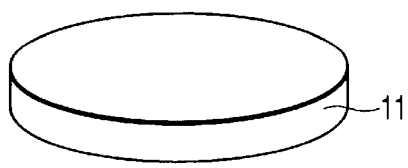
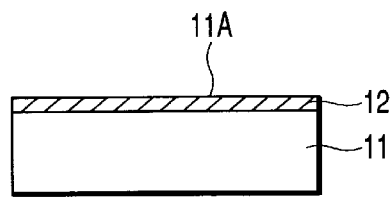
FIG. 23A          FIG. 23B
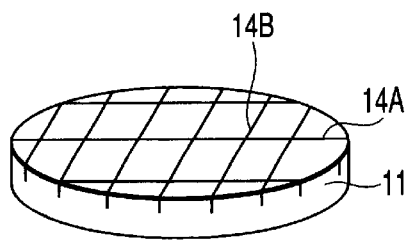
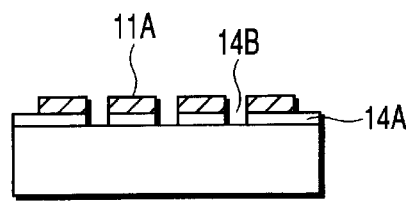
FIG. 24A          FIG. 24B
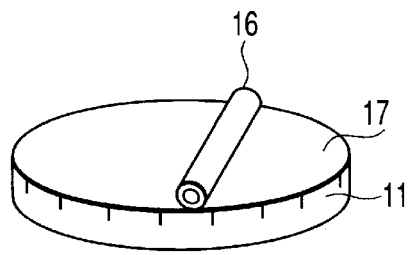
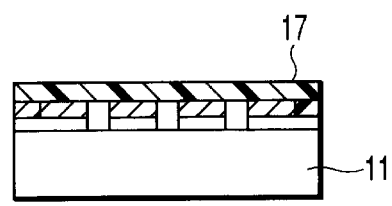
FIG. 25A          FIG. 25B
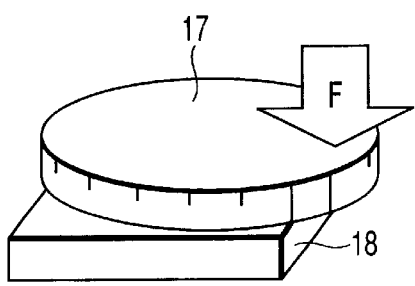
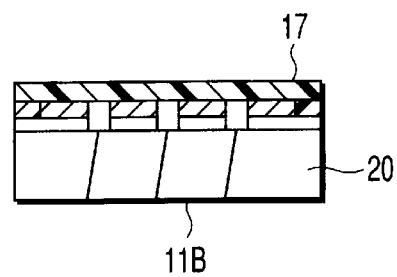
FIG. 26A          FIG. 26B

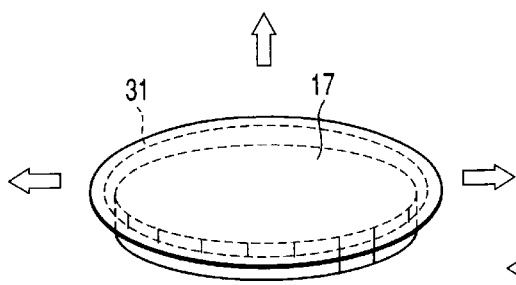
F I G. 35A
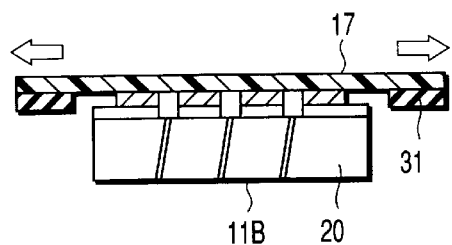
F I G. 35B
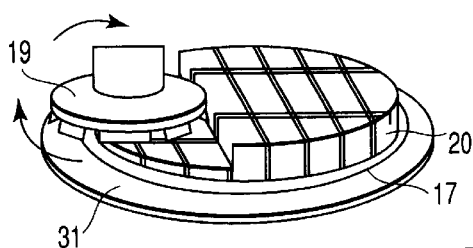
F I G. 36A
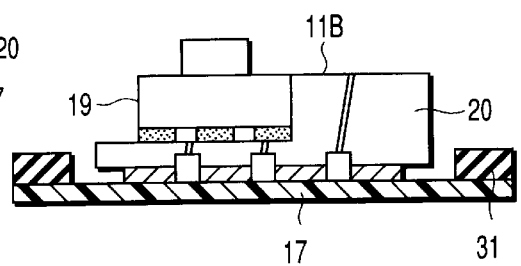
F I G. 36B
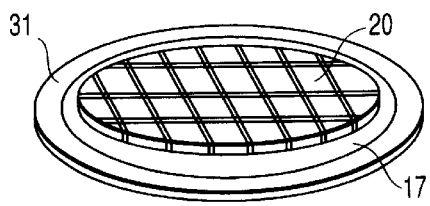
F I G. 37A
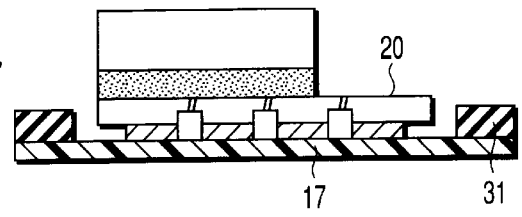
F I G. 37B

WAFER SPLITTING METHOD USING CLEAVAGE

CROSS-REFERENCE TO RELATED APPLICATIONS

This application is based upon and claims the benefit of priority from the prior Japanese Patent Applications No. 2001-367949, filed Nov. 30, 2001; and No. 2002-307169, filed Oct. 22, 2002, the entire contents of both of which are incorporated herein by reference.

BACKGROUND OF THE INVENTION

1. Field of the Invention

The present invention is related to a method of manufacturing a semiconductor device, and more specifically, to a method of splitting a wafer, on which semiconductor devices have been formed, into individual chips.

2. Description of the Related Art

During a process of manufacturing a semiconductor device, a wafer on which all elements have been formed is split along dicing lines or chip splitting lines and thus divided into a plurality of chips (also referred to as "dies" or "pellets"). These chips are stuck to an adhesive sheet, and sequentially picked up therefrom. Further steps to complete the manufacturing of the semiconductor devices may include a step of mounting each chip on a lead frame and a TAB tape or a step of sealing the chip into a package.

In recent years, there has been a demand for reduction in the thickness of chips which allows for thinner packages. One way to reduce the thickness of chips is to grind or etch the back surface of a wafer. However, thinner wafers are likely to break during conveyance between various manufacturing steps (manufacturing apparatuses), and cracking or chipping is likely to occur during dicing.

As a method of solving this problem, a manufacturing method called "dicing-before-grinding" has been proposed. FIGS. 1A and 1B to FIGS. 7A to 7B sequentially show steps of dividing a wafer, on which all elements have been formed, into individual chips using the method of dicing-before-grinding. FIGS. 1A to 7A are perspective views, and FIGS. 1B to 7B are sectional views.

With the dicing-before-grinding method, various semiconductor elements 22 are first formed in a main surface region of a wafer 21. Then, an element-formed surface 21A of the wafer is diced along dicing lines or chip splitting lines using a diamond blade 23 or the like to form grooves 24A and 24B of a depth slightly greater than the desired thickness (achieved upon completion) of chips (see FIGS. 1A and 1B to FIGS. 4A and 4B). Subsequently, a surface protection film 25 is stuck to the element-formed surface 21A of the wafer 21 (FIGS. 5A and 5B). A wheel 26 with a grindstone is rotated to grind a back surface 21B of the wafer 21 to split the wafer into individual chips 27 while thinning the wafer 21 (FIGS. 6A and 6B). Then, the ground back surface 21B of the chip 27 is mirror-finished by polishing or the like as required to remove streaks resulting from the back surface grinding (FIGS. 7A and 7B).

However, the dicing-before-grinding method serves to remove the streaks on the back surfaces of the chips 27, but fails to remove streaks that may be created on the sides of the chips 27 during dicing or chipping. Thus, the bending strength (or breaking strength) of the chips unavoidably decreases as a result of stress concentration. This in turn leads to cracking of the chips during pick-up or resin-sealing.

As a technique of avoiding this problem, a method has been proposed which comprises wet etching after the back surface of the wafer has been ground. However, this method serves to remove the streaks on the sides of chips but not the chipping on the element-formed surface. Further, a method has been proposed which comprises RIE (Reactive Ion Etching) instead of dicing to form grooves. However, the depth of the grooves that can be formed by RIE is only about 100 μm. This limits the thickness of chips to which this method is applicable.

As described above, the conventional semiconductor manufacturing method using the dicing-before-grinding method leaves much room for improvement because it fails to sufficiently remove streaks that may be created on the sides of chips or chipping that may be formed on the element-formed surface.

Further, several improvements have been proposed but are limited in certain points. Consequently, they are not sufficient to form intended thin chips.

BRIEF SUMMARY OF THE INVENTION

According to an aspect of the present invention, there is provided a method of manufacturing a semiconductor device, the method comprising forming notches in an element-formed surface of a wafer on which semiconductor elements have been formed; sticking a surface protection tape to the element-formed surface of the wafer; cleaving the wafer along a crystal orientation using the notches as starting points; and grinding a back surface of the wafer.

BRIEF DESCRIPTION OF THE SEVERAL VIEWS OF THE DRAWING

FIG. 1A is a perspective view showing a first step of dividing a wafer into individual chips using a conventional dicing-before-grinding method;

FIG. 1B is a sectional view showing the first step of dividing a wafer into individual chips using the dicing-before-grinding method;

FIG. 2A is a perspective view showing a second step of dividing a wafer into individual chips using the dicing-before-grinding method;

FIG. 2B is a sectional view showing the second step of dividing a wafer into individual chips using the dicing-before-grinding method;

FIG. 3A is a perspective view showing a third step of dividing a wafer into individual chips using the dicing-before-grinding method;

FIG. 3B is a sectional view showing the third step of dividing a wafer into individual chips using the dicing-before-grinding method;

FIG. 4A is a perspective view showing a fourth step of dividing a wafer into individual chips using the dicing-before-grinding method;

FIG. 4B is a sectional view showing the fourth step of dividing a wafer into individual chips using the dicing-before-grinding method;

FIG. 9A is a perspective view showing a first step of dividing a wafer into individual chips according to the first embodiment of the present invention;

FIG. 9B is a sectional view showing the first step of dividing a wafer into individual chips according to the first embodiment of the present invention;

FIG. 10A is a perspective view showing a second step of dividing a wafer into individual chips;

FIG. 10B is a sectional view showing the second step of dividing a wafer into individual chips;

FIG. 11A is a perspective view showing a third step of dividing a wafer into individual chips;

FIG. 11B is a sectional view showing the third step of dividing a wafer into individual chips;

FIG. 12A is a perspective view showing a fourth step of dividing a wafer into individual chips;

FIG. 12B is a sectional view showing the fourth step of dividing a wafer into individual chips;

FIG. 21 is a process flow chart describing a method of manufacturing a semiconductor device according to a fourth embodiment of the present invention;

FIG. 22 is a process flow chart describing a method of manufacturing a semiconductor device according to a fifth embodiment of the present invention;

FIG. 23A is a perspective view showing a first step of dividing a wafer into individual chips according to the fifth embodiment of the present invention;

FIG. 23B is a sectional view showing the first step of dividing a wafer into individual chips according to the fifth embodiment of the present invention;

FIG. 24A is a perspective view showing a second step of dividing a wafer into individual chips;

FIG. 24B is a sectional view showing the second step of dividing a wafer into individual chips;

FIG. 25A is a perspective view showing a third step of dividing a wafer into individual chips;

FIG. 25B is a sectional view showing the third step of dividing a wafer into individual chips;

FIG. 26A is a perspective view showing a fourth step of dividing a wafer into individual chips;

FIG. 26B is a sectional view showing the fourth step of dividing a wafer into individual chips;

FIG. 35A is a perspective view showing a fifth step of dividing a wafer into individual chips;

FIG. 35B is a sectional view showing the fifth step of dividing a wafer into individual chips;

FIG. 36A is a perspective view showing a sixth step of dividing a wafer into individual chips;

FIG. 36B is a sectional view showing the sixth step of dividing a wafer into individual chips;

FIG. 37A is a perspective view showing a sixth step of dividing a wafer into individual chips; and FIG. 37B is a sectional view showing the sixth step of dividing a wafer into individual chips.

DETAILED DESCRIPTION OF THE INVENTION

First Embodiment

Figure 5A:
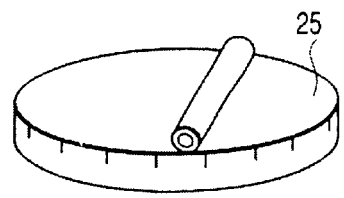
FIG. 5A is a perspective view showing a fifth step of dividing a wafer into individual chips using the dicing-before-grinding method.
Figure 5B:
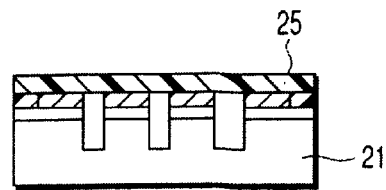
FIG. 5B is a sectional view showing the fifth step of dividing a wafer into individual chips using the dicing-before-grinding method.
Figure 6A:
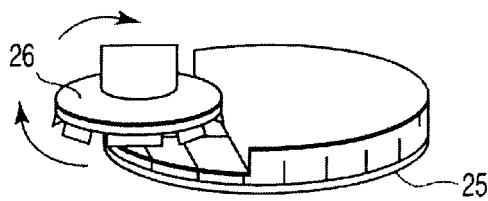
FIG. 6A is a perspective view showing a sixth step of dividing a wafer into individual chips using the dicing-before-grinding method.
Figure 6B:
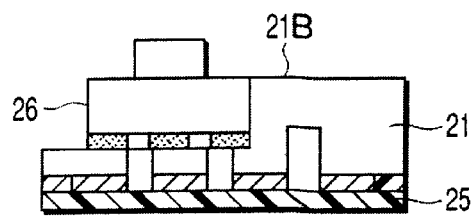
FIG. 6B is a sectional view showing the sixth step of dividing a wafer into individual chips using the dicing-before-grinding method.
Figure 7A:
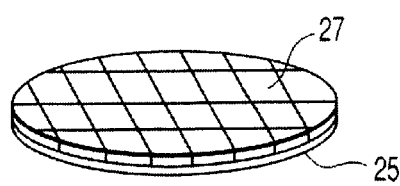
FIG. 7A is a perspective view showing a seventh step of dividing a wafer into individual chips using the dicing-before-grinding method.
Figure 7B:
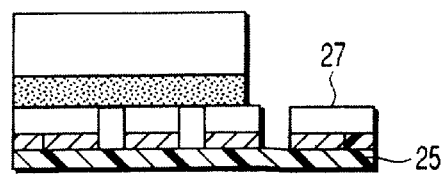
FIG. 7B is a sectional view showing the seventh step of dividing a wafer into individual chips using the dicing-before-grinding method.
Figure 8:
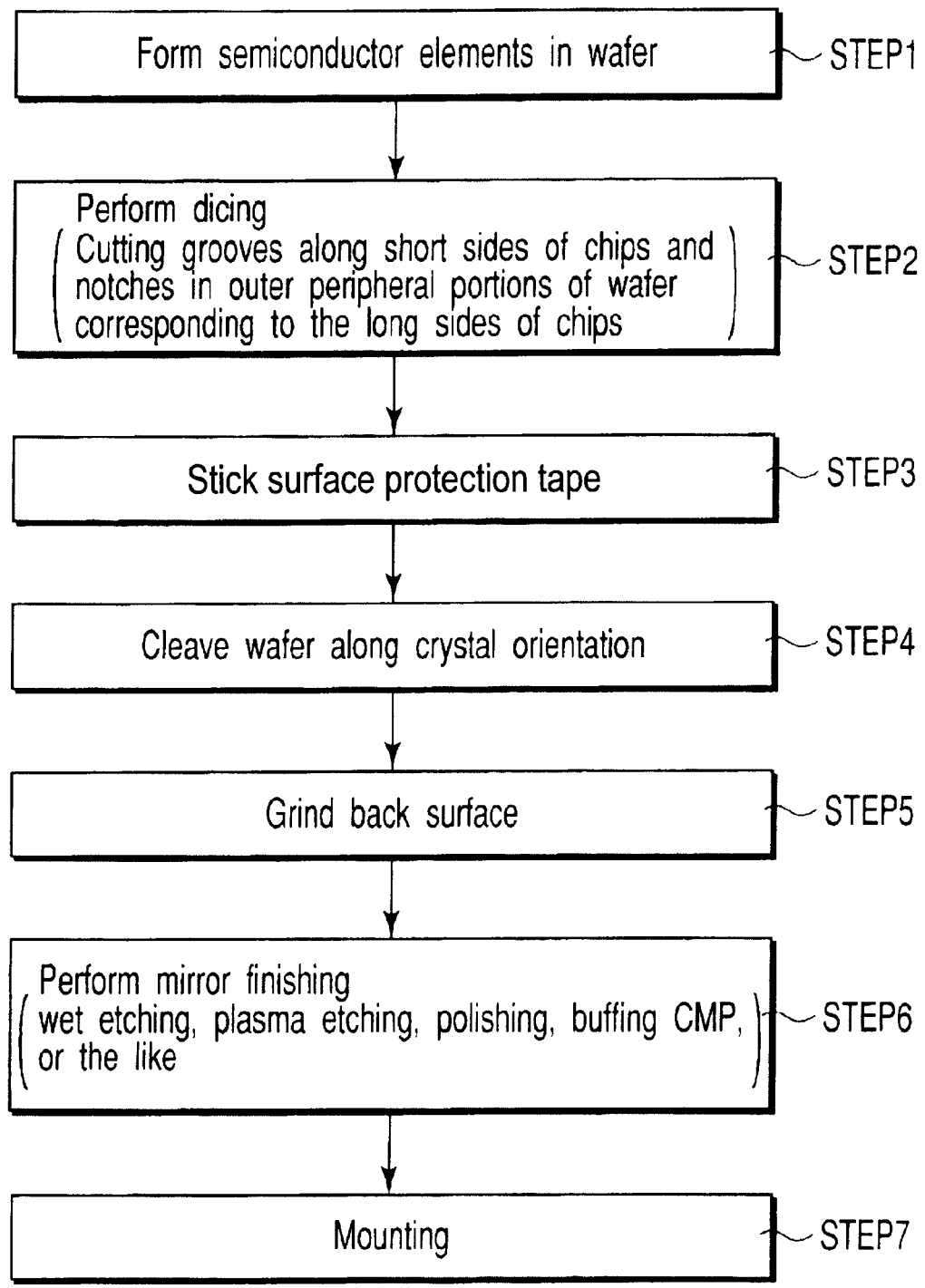
FIG. 8 is a process flow chart describing a method of manufacturing a semiconductor device according to a first embodiment of the present invention.

FIG. 8 is a process flow chart describing a method of manufacturing a semiconductor device according to a first embodiment of the present invention. Further, FIGS. 9A and 9B to FIGS. 16A to 16B sequentially show steps of dividing a wafer into individual chips. FIGS. 9A to 16A are perspective views, and FIGS. 9B to 16B are sectional views.

First, as shown in FIGS. 9A and 9B, various semiconductor elements 12 are formed in a main surface region of a wafer 11 using a well-known process (STEP 1).

Then, as shown in FIGS. 10A and 10B, an element-formed surface 11A of the wafer 11 is diced along dicing lines or chip splitting lines using a diamond blade 13 or the like to cut grooves 14 of a depth slightly greater than the desired thickness (achieved upon completion) of chips. Further, as shown in FIGS. 11A and 11B, notches 15 as starting points for cleavage are formed along an outer peripheral portion of the wafer corresponding to long sides of chips (STEP 2). The notches 15 are preferably formed along, for example, a crystal orientation <100>.

Thus, as shown in FIGS. 12A and 12B, on the element-formed surface 11A of the wafer 11, the grooves 14 are formed at positions corresponding to short sides of chips, while the notches 15 are formed along the outer peripheral portion of the wafer corresponding to the long sides of chips.

Figure 13A:
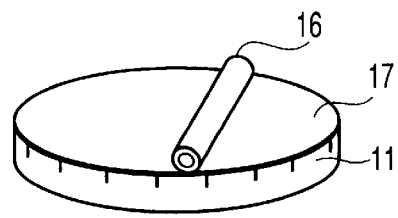
FIG. 13A is a perspective view showing a fifth step of dividing a wafer into individual chips.
Figure 13B:
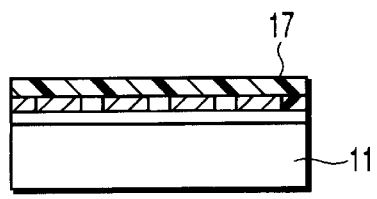
FIG. 13B is a sectional view showing the fifth step of dividing a wafer into individual chips.

Subsequently, as shown in FIGS. 13A and 13B, to protect the element-formed surface 11A of the wafer 11, a surface protection film 17 is stuck to the element-formed surface 11A using a roller 16 or the like (STEP 3).

Figure 14A:
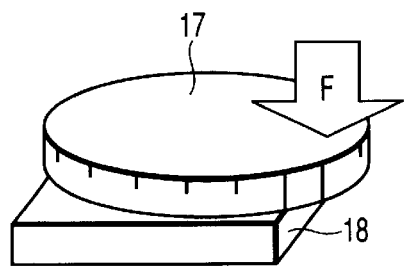
FIG. 14A is a perspective view showing a sixth step of dividing a wafer into individual chips.
Figure 14B:
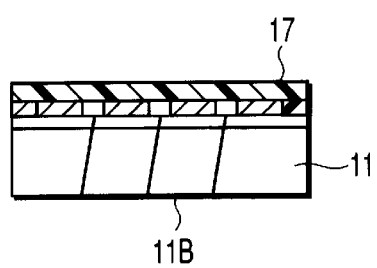
FIG. 14B is a sectional view showing the sixth step of dividing a wafer into individual chips.

Then, as shown in FIGS. 14A and 14B, a jig 18 is pressed against the wafer 11 from its back surface 11B, and the wafer is loaded from its front surface as shown by arrow F. The wafer is thus cleaved along the crystal orientation using the notches 15, which are formed along the outer peripheral portion of the wafer 11, as starting points. Alternatively, the wafer 11 may be cleaved along the crystal orientation using the notches 15 as starting points, by loading the wafer 11 from its back surface 11B along chip splitting lines. The wafer 11 may also be cleaved along the crystal orientation using the notches 15 as starting points while sequentially moving the jig 18 or the wafer 11 (STEP 4).

Figure 15A:
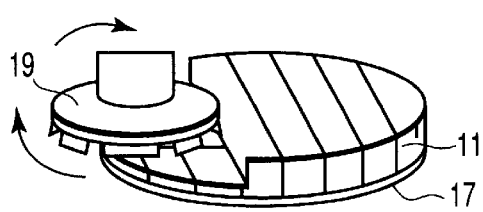
FIG. 15A is a perspective view showing a seventh step of dividing a wafer into individual chips.
Figure 15B:
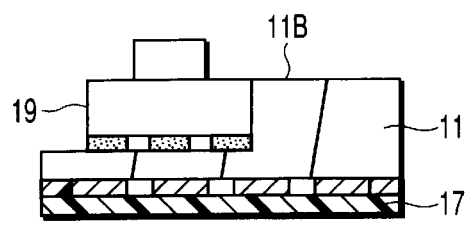
FIG. 15B is a sectional view showing the seventh step of dividing a wafer into individual chips.

Subsequently, as shown in FIGS. 15A and 15B, the back surface 11B of the wafer is ground by rotating a wheel 19 with a grindstone at a high speed of 4,000 to 6,000 rpm. Thus, the wafer is split into individual chips while being thinned (STEP 5). The grindstone is molded by compacting an artificial diamond with a phenol resin. This back surface grinding step is often carried out using two spindles. Alternatively, the wafer may be roughly ground using one spindle with a grain density of 320 to 600 and then mirror-finished using two spindles with a grain density of 1,500 to 2,000. Furthermore, the wafer may be ground using three spindles. During this back surface grinding, damage areas formed at the bottoms of the grooves due to dicing can be removed by continuing the grinding operation after the grindstone reaches the grooves 14 to obtain a desired chip thickness.

Further, before the back surface grinding, the surface protection tape 17 may be stretched to open the cleaved surfaces of the wafer 11 and the diced surfaces formed along the dicing lines, thereby preventing separated chips 20 from interfering with one another to cause chipping.

Figure 16A:
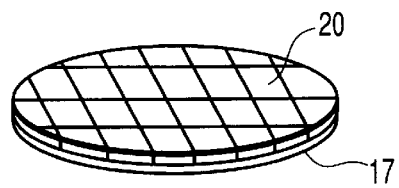
FIG. 16A is a perspective view showing an eighth step of dividing a wafer into individual chips.
Figure 16B:
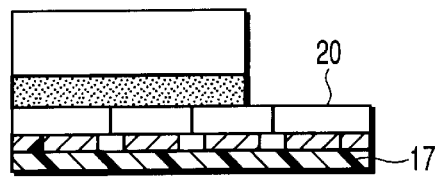
FIG. 16B is a sectional view showing the eighth step of dividing a wafer into individual chips.

Then, as shown in FIGS. 16A and 16B, the back surfaces of the chips 20 are mirror-finished using wet etching, plasma etching, polishing, buffing, or CMP (Chemical Mechanical Polishing) to remove streaks resulting from the back surface grinding (STEP 6).

Steps of a well-known semiconductor device manufacturing method follow to complete the semiconductor device, including picking up the chip 20, mounting the chip on a lead frame and a TAB tape, and sealing the chip in a package (STEP 7).

According to the above manufacturing method, the splitting operation along the long sides of the chip is performed on the basis of cleavage. The chips thus formed are unlikely to be damaged on their long sides and element-formed surfaces, and the bending strength of the chips is improved.

Further, the wafer is cleaved before the grinding of its back surface when the wafer is still thick and rigid. Consequently, the wafer is likely to be cleaved along the crystal orientation, and cleavage errors are reduced to a minimum.

Furthermore, since the wafer is cleaved along the crystal orientation, no spaces are required for cutting, eliminating the needs for dicing lines (or chip splitting lines), which are required by the prior art. Thus, the number of chips per wafer is increased.

Figure 17A:
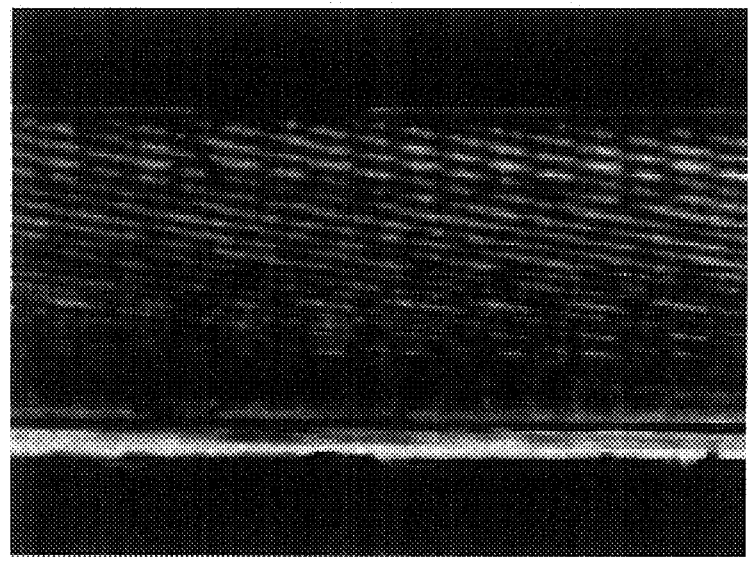
FIG. 17A is a microscopic photograph of a side of a chip formed using the conventional semiconductor device manufacturing method.
Figure 17B:
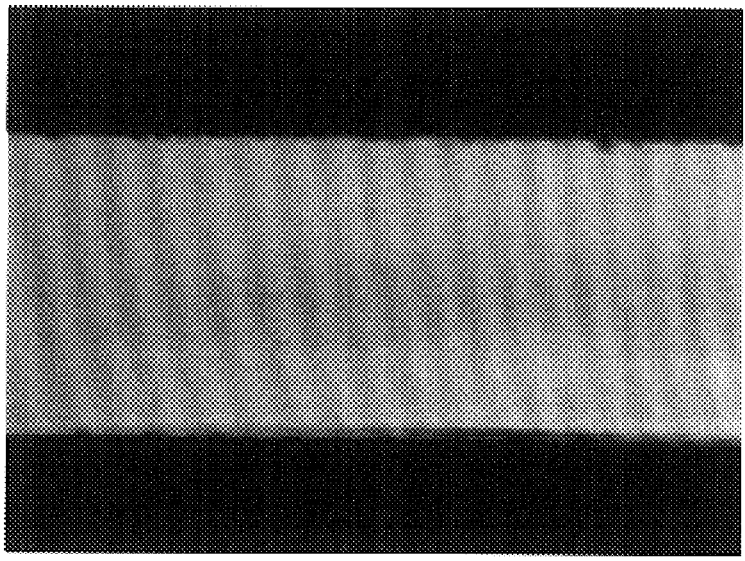
FIG. 17B is a microscopic photograph of a side of a chip formed using the semiconductor device manufacturing method according to the first embodiment of the present invention.

FIGS. 17A and 17B compare the prior art with the first embodiment in terms of the long side of a divided chip. FIG. 17A is a microscopic photograph of a side of a chip formed using the conventional semiconductor device manufacturing method. FIG. 17B is a microscopic photograph of a side of a chip formed using the semiconductor device manufacturing method according to the first embodiment of the present invention.

As is apparent from a comparison of FIG. 17A with FIG. 17B, a large number of streaks resulting from dicing are present on the side of the chip formed using the conventional semiconductor device manufacturing method. On the other hand, the side of chip is smooth which has been formed by cleavage according to the semiconductor device manufacturing method of the first embodiment, and the amount of chipping on the element-formed surface is reduced. Thus, the present invention provides for a less concentrated stress and an increased bending strength of chips. As a result, the chips are prevented from cracking during a pickup operation, a resin sealing operation, or the like.

Figure 18:
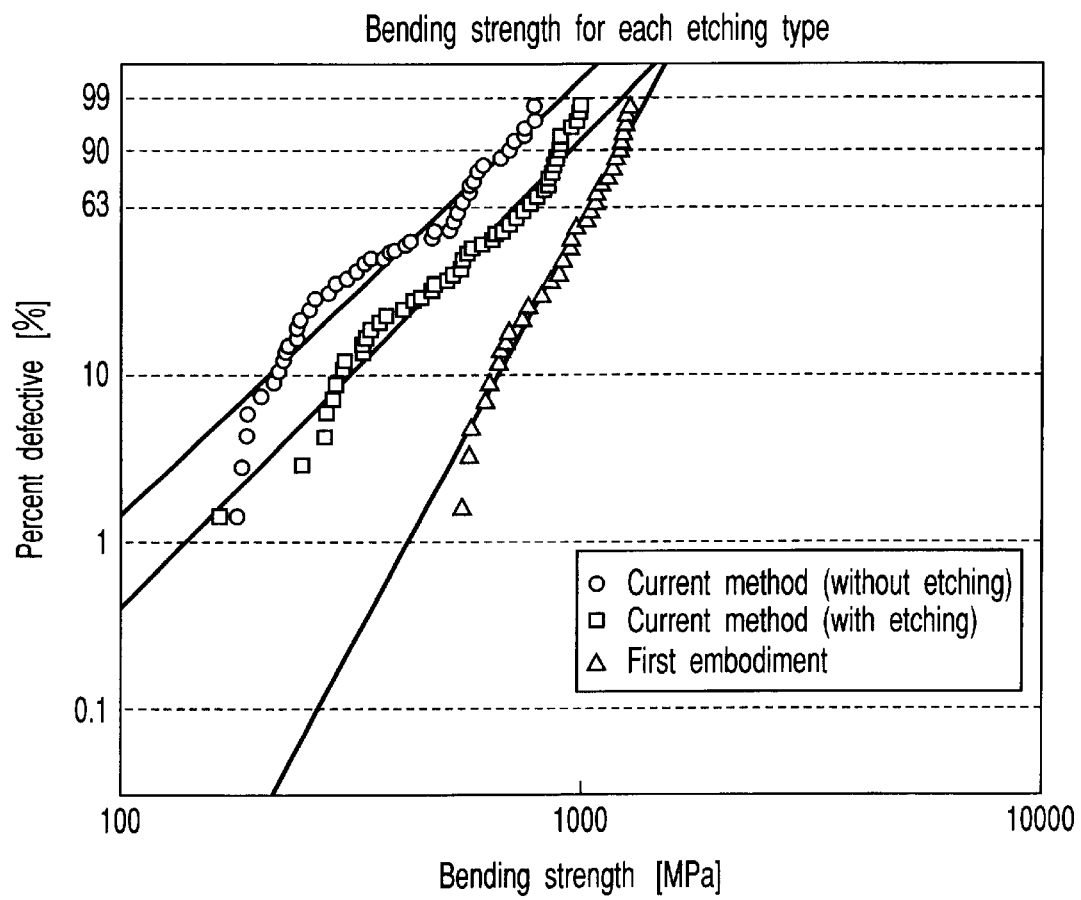
FIG. 18 is a diagram showing a comparison of a chip formed using the conventional semiconductor device manufacturing method with a chip formed using the semiconductor device manufacturing method according to the first embodiment of the present invention, in terms of bending strength and percent defective.

FIG. 18 shows a comparison of the conventional semiconductor device manufacturing method with the semiconductor device manufacturing method according to the first embodiment of the present invention in terms of the relationship between the bending strength [MPa] and percent defective [%] of chips. This figure plots the bending strength [MPa] and percent defective [%] of chips in three cases; circles in the figure indicate the case in which the dicing-before-grinding method is used but the sides of chips are not etched, squares indicate the case in which the dicing-before-grinding method is used and the sides of chips are etched, and triangles indicate the case in which a wafer is split according to the semiconductor device manufacturing method of the first embodiment of the present invention.

According to the semiconductor device manufacturing method of the first embodiment of the present invention, the bending strength of the chip increases drastically, while the percent defective decreases correspondingly.

Second Embodiment

Figure 19:
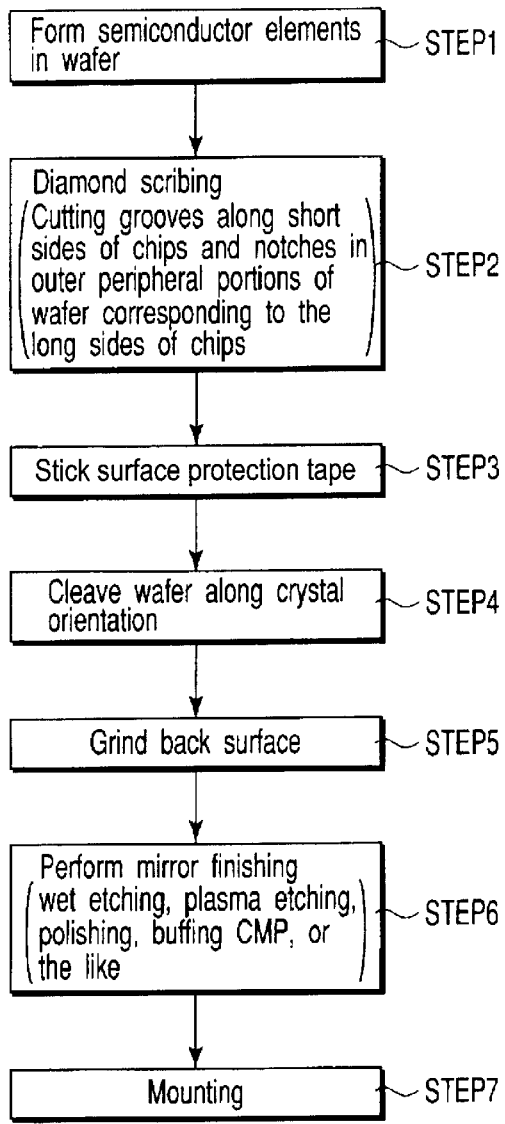
FIG. 19 is a process flow chart describing a method of manufacturing a semiconductor device according to a second embodiment of the present invention.

FIG. 19 is a process flow chart describing a semiconductor device manufacturing method according to a second embodiment of the present invention. The second embodiment differs from the first embodiment, described above, in that, at STEP 2, grooves having a depth greater than a desired chip thickness are formed along dicing lines or chip splitting lines corresponding to the short sides of chips using diamond scribing instead of dicing, and in that notches as starting points for cleavage are formed only along an outer peripheral portion of a wafer corresponding to the long sides of chips.

The other basic manufacturing steps are similar to those of the first embodiment. Thus, their detailed description is omitted.

This manufacturing method also produces effects similar to those of the first embodiment.

Third Embodiment

Figure 20:
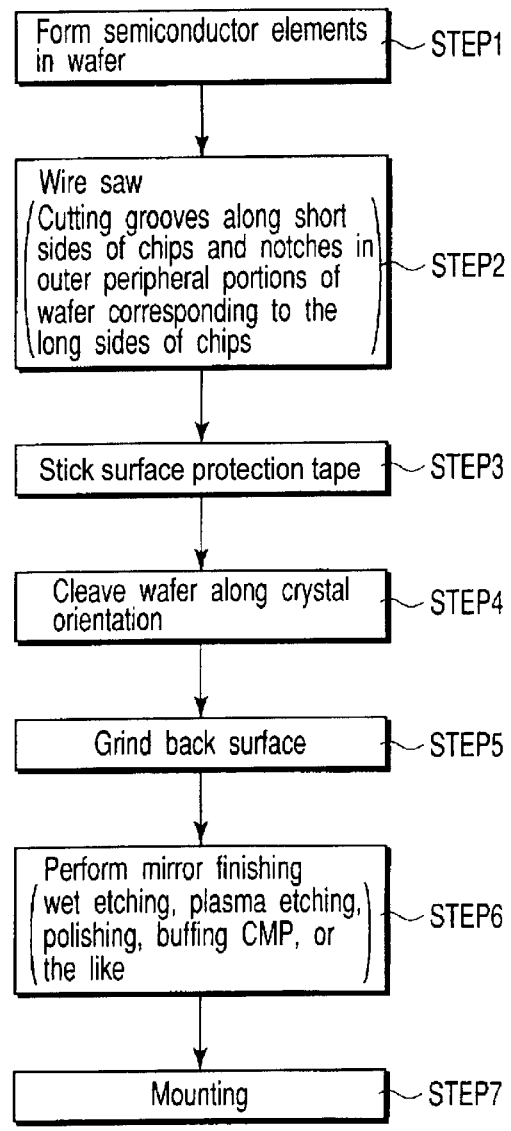
FIG. 20 is a process flow chart describing a method of manufacturing a semiconductor device according to a third embodiment of the present invention.

FIG. 20 is a process flow chart describing a semiconductor device manufacturing method according to a third embodiment of the present invention. The third embodiment differs from the first embodiment, described above, in that, at STEP 2, grooves having a depth greater than a desired chip thickness are formed along dicing lines or chip splitting lines corresponding to the short sides of chips using a wire saw instead of dicing, and in that notches as starting points for cleavage are formed only along an outer peripheral portion of a wafer corresponding to the long sides of chips.

The other basic manufacturing steps are similar to those of the first embodiment. Thus, their detailed description is omitted.

This manufacturing method also produces effects similar to those of the first embodiment.

Fourth Embodiment

FIG. 21 is a process flow chart useful in describing a semiconductor device manufacturing method according to a fourth embodiment of the present invention. The fourth embodiment differs from the first embodiment, described above, in that, at STEP 2, grooves having a depth greater than a desired chip thickness are formed along dicing lines or chip splitting lines corresponding to the short sides of chips using a router instead of dicing, and in that notches as starting points for cleavage are formed only along an outer peripheral portion of a wafer corresponding to the long sides of chips.

The other basic manufacturing steps are similar to those of the first embodiment. Thus, their detailed description is omitted.

This manufacturing method also produces effects similar to those of the first embodiment.
Variations Of course, the first to fourth embodiments, described above, may be appropriately combined together to selectively use dicing, diamond scribing, a wire saw, and a router to cut grooves having a depth greater than the chip thickness and notches as starting points for cleavage.

Fifth Embodiment

FIG. 22 is a process flow chart describing a semiconductor device manufacturing method according to a fifth embodiment of the present invention. Further, FIGS. 23A and 23B to FIGS. 28A and 28B sequentially show steps of dividing a wafer into individual chips. FIGS. 23A to 28A are perspective views, and FIGS. 23B to 28B are sectional views.

First, as shown in FIGS. 23A and 23B, the various semiconductor elements 12 are formed in the main surface region of the wafer 11 using a well-known process (STEP 1).

Then, as shown in FIGS. 24A and 24B, on the element-formed surface 11A of the wafer 11, grooves 14A and 14B as starting points for cleavage (notches as starting points for cleavage) are formed along the outer periphery (dicing lines or chip splitting lines) of each chip by RIE (STEP 2).

Subsequently, as shown in FIGS. 25A and 25B, the surface protection film 17 is stuck to the element-formed surface 11A of the wafer 11 using the roller 16 or the like (STEP 3).

Then, as shown in FIGS. 26A and 26B, the jig 18 is pressed against the wafer from its back surface 11B, and the wafer is loaded from its front surface as shown by arrow F. The wafer is thus cleaved along the crystal orientation using the grooves 14A or 14B as starting points. Alternatively, the wafer 11 may be cleaved along the crystal orientation using the grooves 14A or 14B as starting points, by loading the wafer 11 from its back surface 11B along the chip splitting lines. The wafer 11 may also be cleaved along the crystal orientation using the grooves 14A or 14B as starting points while sequentially moving the jig 18 or the wafer 11 (STEP 4).

Figure 27A:
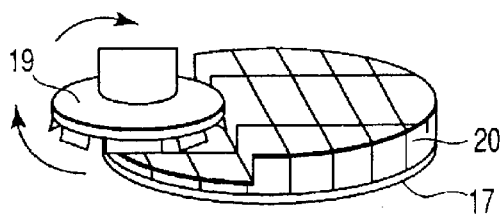
FIG. 27A is a perspective view showing a fifth step of dividing a wafer into individual chips.
Figure 27B:
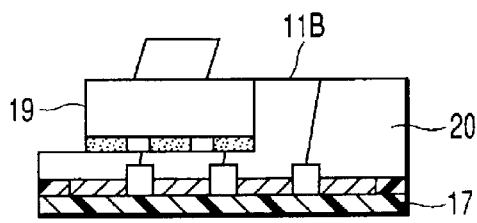
FIG. 27B is a sectional view showing the fifth step of dividing a wafer into individual chips.

Subsequently, as shown in FIGS. 27A and 27B, the back surface of the wafer is thinned by grinding by rotating the wheel 19 (STEP 5). Before the back surface grinding, the surface protection tape 17 may be stretched to open the cleaved surfaces of the wafer 11, thereby preventing the separated chips 20 from interfering with one another to cause chipping.

Figure 28A:
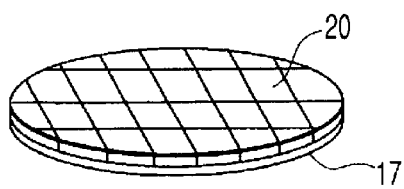
FIG. 28A is a perspective view showing a sixth step of dividing a wafer into individual chips.
Figure 28B:
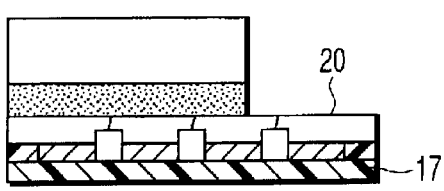
FIG. 28B is a sectional view showing the sixth step of dividing a wafer into individual chips.

Then, as shown in FIGS. 28A and 28B, the back surfaces of the chips 20 are mirror-finished using wet etching, plasma etching, polishing, buffing, or CMP to remove streaks resulting from the back surface grinding (STEP 6).

Steps of a well-known semiconductor device manufacturing method follow to complete the semiconductor device, including picking up the chip 20, mounting the chip on a lead frame and a TAB tape, and sealing the chip in a package (STEP 7).

According to the above manufacturing method, the wafer is divided into individual chips by RIE or by a laser irradiation and cleavage. The chips thus formed are unlikely to be damaged on their sides and element-formed surfaces, and the bending strength of the chips is improved.

Further, the wafer is cleaved before the grinding of its back surface when the wafer is still thick and rigid. Consequently, the wafer is likely to be cleaved along the crystal orientation, and cleavage errors are reduced to a minimum.

Furthermore, since the wafer is cleaved along the crystal orientation, no spaces are required for cutting, eliminating the needs for dicing lines (or chip splitting lines), which are required by the prior art. Thus, the number of chips per wafer is increased.

Moreover, the dicing operation is limited in the achieved chip thickness, but can be combined with cleavage to avoid this limitation.

Sixth Embodiment

Figure 29:
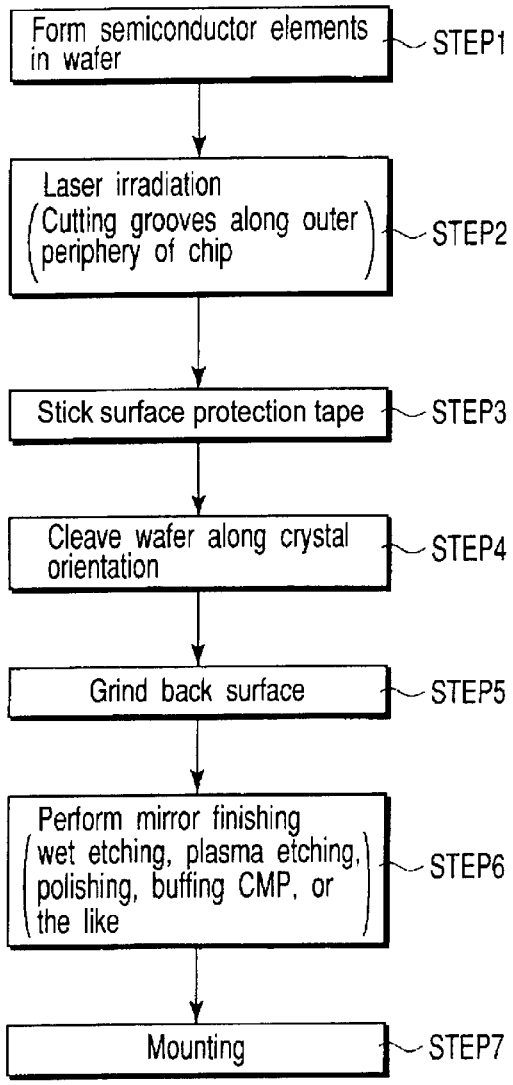
FIG. 29 is a process flow chart describing a method of manufacturing a semiconductor device according to a sixth embodiment of the present invention.

FIG. 29 is a process flow chart describing a semiconductor device manufacturing method according to a sixth embodiment of the present invention. The sixth embodiment differs from the fifth embodiment, described above, in that, at STEP 2, grooves 14A or 14B are formed along the outer periphery (dicing lines or chip splitting lines) of the wafer by laser irradiation instead of RIE, and serve as starting points for cleavage.

The other basic manufacturing steps are similar to those of the fifth embodiment. Thus, their detailed description is omitted.

This manufacturing method also produces effects similar to those of the fifth embodiment.

Seventh Embodiment

Figure 30:
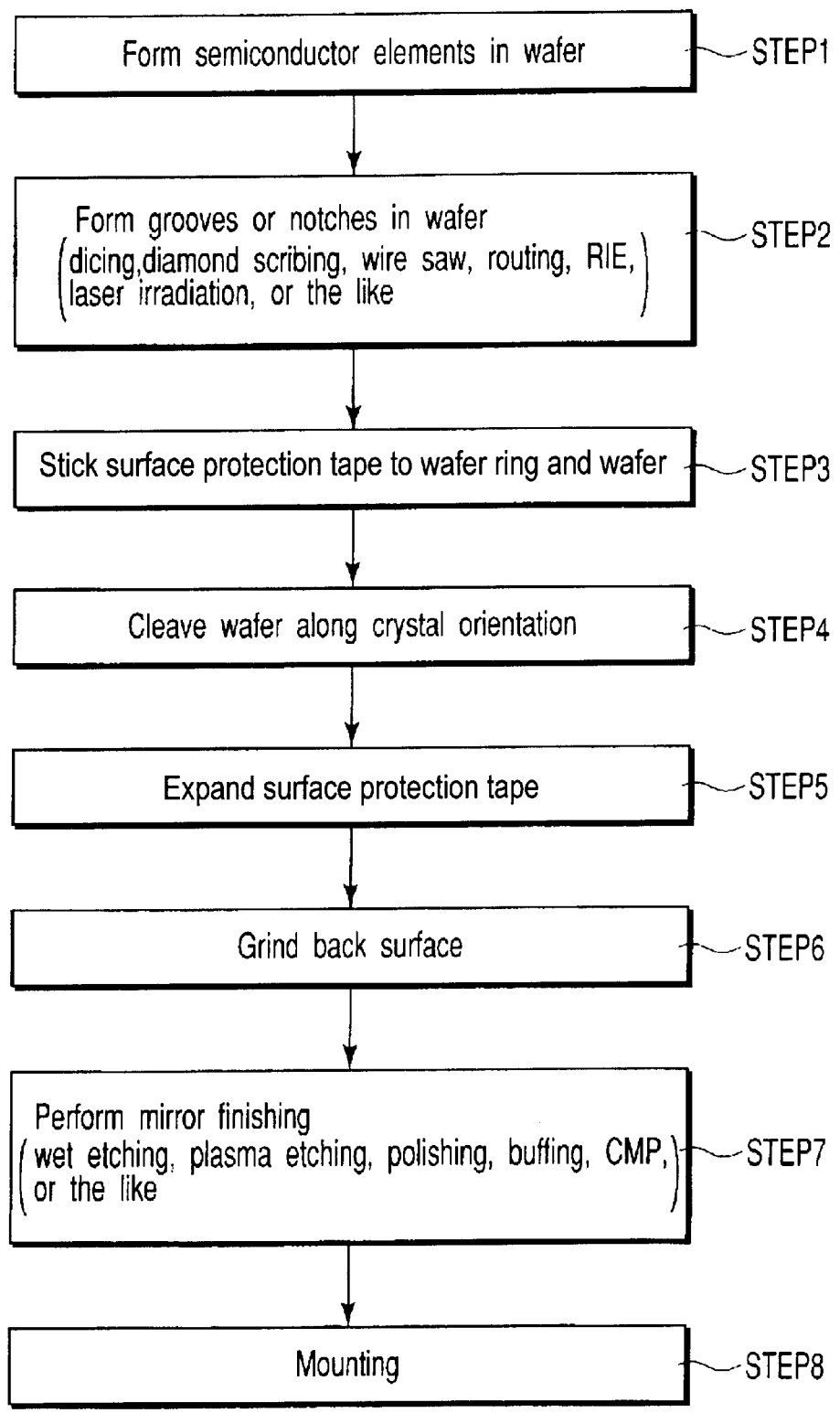
FIG. 30 is a process flow chart describing a method of manufacturing a semiconductor device according to a seventh embodiment of the present invention.

FIG. 30 is a process flow chart describing a semiconductor device manufacturing method according to a seventh embodiment of the present invention. Further, FIGS. 31A and 31B to FIGS. 37A and 37B sequentially show steps of dividing a wafer into individual chips. FIGS. 31A to 37A are perspective views, and FIGS. 31B to 37B are sectional views.

Figure 31A:
FIG. 31A is a perspective view showing a first step of dividing a wafer into individual chips according to the seventh embodiment of the present invention.
Figure 31B:
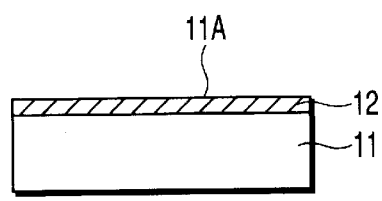
FIG. 31B is a sectional view showing the first step of dividing a wafer into individual chips according to the seventh embodiment of the present invention.

First, as shown in FIGS. 31A and 31B, the various semiconductor elements 12 are formed in the main surface region of the wafer 11 (STEP 1).

Figure 32A:
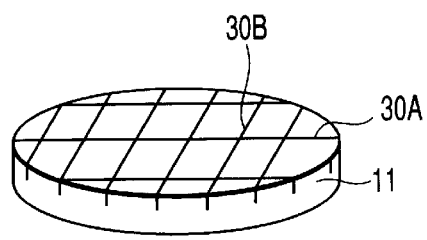
FIG. 32A is a perspective view showing a second step of dividing a wafer into individual chips.
Figure 32B:
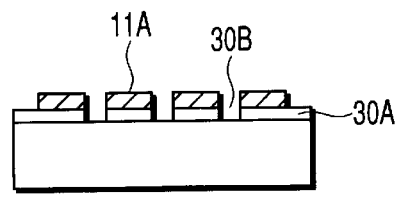
FIG. 32B is a sectional view showing the second step of dividing a wafer into individual chips.

Then, as shown in FIGS. 32A and 32B, on the element-formed surface 11A of the wafer 11, grooves or notches 30A and 30B as starting points for cleavage are formed along the outer periphery (dicing lines or chip splitting lines) of each chip by RIE (STEP 2). The grooves or notches 30A and 30B as starting points for cleavage may be formed using any of dicing, diamond scribing, a wire saw, a router, RIE, laser irradiation, or the like as described previously in the first to sixth embodiments.

Figure 33A:
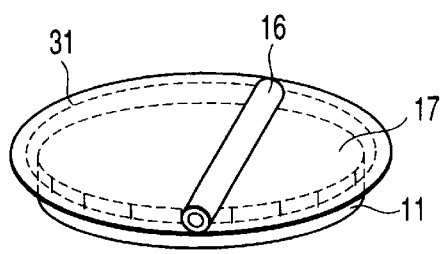
FIG. 33A is a perspective view showing a third step of dividing a wafer into individual chips.
Figure 33B:
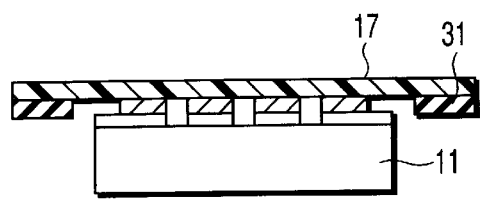
FIG. 33B is a sectional view showing the third step of dividing a wafer into individual chips.

Subsequently, as shown in FIGS. 33A and 33B, a wafer ring 31 and the wafer 11 are positioned. Then, the extendable surface protection film 17 is stuck to the wafer ring 31 and to the element-formed surface 11A of the wafer 11 using the roller 16 or the like (STEP 3).

Figure 34A:
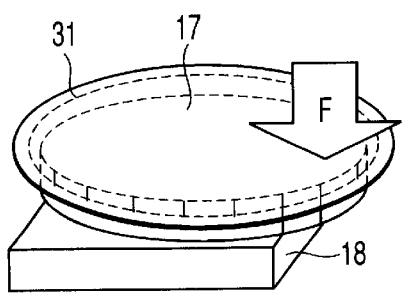
FIG. 34A is a perspective view showing a fourth step of dividing a wafer into individual chips.
Figure 34B:
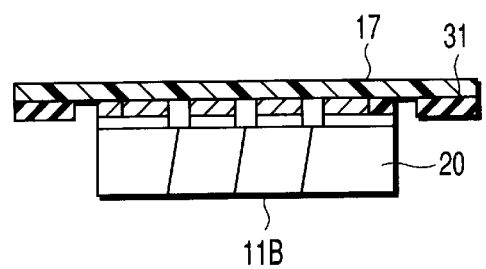
FIG. 34B is a sectional view showing the fourth step of dividing a wafer into individual chips.

Then, as shown in FIGS. 34A and 34B, the jig 18 is pressed against the wafer from its back surface 11B, and the wafer is loaded from its front surface as shown by arrow F. The wafer is thus cleaved a long the crystal orientation using the grooves or notches 30A and 30B, which are formed along the peripheral portion of the wafer 11, as starting points. Alternatively, the wafer 11 may be cleaved along the crystal orientation using the grooves or notches 30A and 30B as starting points, by loading the wafer 11 from its back surface 11B along the chip splitting lines. The wafer 11 may also be cleaved along the crystal orientation using the grooves or notches 30A and 30B as starting points while sequentially moving the jig 18 or the wafer 11 (STEP 4).

Subsequently, as shown in FIGS. 35A and 35B, the surface protection tape 17 is stretched to open the cleaved surfaces of each of the chips into which the wafer has been split by cleavage so that the distance between the cleaved surface is at least 100 μm (STEP 5). FIGS. 35A and 35B show that the surface protection tape 17 is stretched in four directions. However, the proper distance between the cleaved surfaces of each chip 20 is also obtained by pressing the wafer ring 31 against the wafer 11.

Then, as shown in FIGS. 36A and 36B, the back surface 11B of the wafer is ground by rotating the wheel 19 with the grindstone at a high speed of 4,000 to 6,000 rpm. Thus, the wafer is split into individual chips while being thinned (STEP 6). The grindstone is molded by compacting an artificial diamond with a phenol resin. This back surface grinding step is often carried out using two spindles. Alternatively, the wafer may be roughly ground using one spindle with a grain density of 320 to 600 and then mirror-finished using two spindles with a grain density of 1,500 to 2,000. Furthermore, the wafer may be ground using three spindles.

Further, in this case, the intervals between the chips 20 can be increased. Accordingly, by grinding the back surface of the wafer 11 using an elastic pad material, for example, polyurethane, an arbitrary edge of the back surface of the chip 20 can be chamfered easily. This increases the bending strength of the chip 20.

Then, as shown in FIGS. 37A and 37B, the back surfaces of the chips 20 are mirror-finished using wet etching, plasma etching, polishing, buffing, or CMP to remove streaks resulting from the back surface grinding (STEP 7).

Steps of a well-known semiconductor device manufacturing method follow to complete the semiconductor device, including picking up the chip 20, mounting the chip on a lead frame and a TAB tape, and sealing the chip in a package (STEP 8).

According to the above manufacturing method, the wafer is split by cleavage. The chips thus formed are unlikely to be damaged on their sides and element-formed surfaces, and the bending strength of the chips is improved.

Further, the wafer is cleaved before grinding of its back surface when it is still thick and rigid. Consequently, the wafer is likely to be cleaved along the crystal orientation, and cleavage errors are reduced to a minimum.

Furthermore, since the wafer is split by cleavage, no spaces are required for cutting, eliminating the needs for dicing lines (or chip splitting lines), which are required by the prior art. This increases the number of chips obtained from one wafer.

Moreover, after the wafer 11 has been cleaved, the surface protection tape 17 is expanded to separate the chips 20 from each other. Then, in this state, the wafer 11 is stuck to the wafer ring 31, which prevents the chips 20 from interfering with each other during conveyance, and helps create chips that are unlikely to be damaged on their sides and surfaces. As a result, the bending strength of the chips can be increased. Furthermore, after the chips have been cleaved, the surface protection tape 17 is stretched, and the back surface is ground in this state. This reduces the level of interference with the chips 20 caused by rocking of the chips 20 during grinding. Consequently, chips thus created are unlikely to be damaged on their sides and surfaces. This embodiment also substantially reduces the probability that silicon scraps resulting from back surface grinding or mirror polishing or dusts from polishing material remain on the sides of the chip. This also increases the bending strength of the chip.

Further, according to this embodiment, the intervals between the chips can be increased, so that while the back surface of the chip is being ground, an arbitrary edge of the back surface can be chamfered easily. This increases the bending strength of the chip.

As described above, according to one aspect of the present invention, a semiconductor device manufacturing method is provided which reduces the possibility of creating streaks on the sides of the chip or forming chipping on the element-formed surface.

Further, a semiconductor device manufacturing method is provided which suppresses a decrease in the bending strength of chips with a reduced thickness.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

forming notches in an element-formed surface of a wafer on which semiconductor elements have been formed, wherein a plurality of chips are to be formed out of the wafer;

sticking a surface protection tape to the element-formed surface of the wafer;

cleaving the wafer along a crystal orientation using the notches as starting points; and grinding a back surface of the wafer, wherein the back surface of the wafer is ground with the surface protection tape being stretched so that cleaved surfaces of the wafer are separated from each other.

2. The method according to claim 1, further comprising mirror-finishing the ground back surface of the wafer.

3. The method according to claim 2, wherein the mirror-finishing includes wet-etching the ground back surface of the wafer.

4. The method according to claim 2, wherein the mirror-finishing includes plasma-etching the ground back surface of the wafer.

5. The method according to claim 2, wherein the back surface of the wafer is mirror-finished by polishing the ground back surface of the wafer.

6. The method according to claim 2, wherein the back surface of the wafer is mirror-finished by buffing the ground back surface of the wafer.

7. The method according to claim 2, wherein the back surface of the wafer is mirror-finished by polishing the ground back surface of the wafer by CMP (Chemical Mechanical Polishing).

8. The method according to claim 1, wherein the surface protection tape is stuck to a wafer ring.

9. The method according to claim 1, wherein the notches are formed by dicing the wafer to form grooves along an outer peripheral portion of the wafer corresponding to long sides of the chips.

10. The method according to claim 9, further comprising cutting grooves in surfaces of the wafer corresponding to short sides of chips before sticking the surface protection tape to the element-formed surface, the grooves having a depth greater than a desired thickness of the chips.

11. The method according to claim 1, wherein the notches are formed by diamond scribing the wafer to form grooves along an outer peripheral portion of the wafer corresponding to long sides of the chips.

12. The method according to claim 11, further comprising cutting grooves in surfaces of the wafer corresponding to short sides of chips before sticking the surface protection tape to the element-formed surface, the grooves having a depth greater than a desired thickness of the chips.

13. The method according to claim 11, further comprising cutting grooves in surfaces of the wafer corresponding to short sides of the chips before sticking the surface protection tape to the element-formed surface, the grooves having a depth greater than a desired thickness of the chips.

14. The method according to claim 1, wherein the notches are formed by using a wire saw to form grooves along an outer peripheral portion of the wafer corresponding to long sides of the chips.

15. The method according to claim 1, wherein the notches are formed by using a router to form grooves along an outer peripheral portion of the wafer corresponding to long sides of the chips.

16. The method according to claim 15, further comprising cutting grooves in surfaces of the wafer corresponding to short sides of the chips before sticking the surface protection tape to the element-formed surface, the grooves having a depth greater than a desired thickness of the chips.

17. The method according to claim 1, wherein the notches are formed by carrying out RIE (Reactive Ion Etching) along a plurality of dicing lines or chip splitting lines to form grooves.

18. The method according to claim 1, wherein the notches are formed by irradiating the wafer with a laser beam along a plurality of dicing lines or chip splitting lines to form grooves.

19. The method according to claim 1, wherein the wafer is cleaved along the crystal orientation by pressing a jig against the wafer from its back surface.

20. The method according to claim 1, wherein the wafer is cleaved along the crystal orientation by loading the wafer along a plurality of dicing lines.

* * * * *